US012757671B2

(12) United States Patent
Endo et al.

(10) Patent No.: US 12,757,671 B2
(45) Date of Patent: Oct. 6, 2026

(54) HEATING/COOLING DEVICE AND HEATING/COOLING METHOD

(71) Applicant: Tokyo Electron Limited, Tokyo (JP)

(72) Inventors: Shosuke Endo, Nirasaki City (JP); Yohei Midorikawa, Nirasaki City (JP); Yohei Nakagomi, Nirasaki City (JP); Yoshihiro Kobayashi, Nirasaki City (JP); Yasuo Nakatani, Nirasaki City (JP); Susumu Saito, Nirasaki City (JP); Chanseong Ahn, Nirasaki City (JP); Yuta Takahashi, Nirasaki City (JP); Takahiro Kijima, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 1221 days.

(21) Appl. No.: 17/754,446

(22) PCT Filed: Aug. 6, 2020

(86) PCT No.: PCT/JP2020/030196

§ 371 (c)(1),
(2) Date: Apr. 1, 2022

(87) PCT Pub. No.: WO2021/065203

PCT Pub. Date: Apr. 8, 2021

(65) Prior Publication Data

US 2022/0336238 A1 Oct. 20, 2022

(30) Foreign Application Priority Data

Oct. 4, 2019 (JP) ................................ 2019-184004

(51) Int. Cl.

*H10P 72/00* (2026.01)
*H10P 50/00* (2026.01)

(Continued)

(52) U.S. Cl.

CPC ...... *H10P 72/0436* (2026.01); *H10P 72/7602* (2026.01); *H10P 74/238* (2026.01); *H10P 95/90* (2026.01)

(58) Field of Classification Search

None

See application file for complete search history.

(56) References Cited

U.S. PATENT DOCUMENTS 6,479,801 B1 * 11/2002 Shigeoka .............. G01J 5/0003 392/416
6,818,864 B2 * 11/2004 Ptak .................... F27B 17/0025 118/724

(Continued)

FOREIGN PATENT DOCUMENTS

JP 2886101 B2 4/1999
JP 5352103 B2 11/2013

(Continued)

*Primary Examiner* — Ram N Kackar
*Assistant Examiner* — Michelle Crowell
(74) *Attorney, Agent, or Firm* — Armstrong Teasdale LLP

(57) ABSTRACT

A heating/cooling device includes: a chamber; a plurality of substrate holders provided inside the chamber to support substrates; a plurality of LED light sources provided outside the chamber to irradiate the substrates held on the substrate holders with LED light having a wavelength that heats the substrates; a plurality of transmission windows provided between the plurality of substrate holders and the plurality of LED light sources to transmit the LED light radiated from the LED light sources; and a plurality of gas distribution parts provided inside the chamber to distribute and supply a cooling gas to the substrates held on the substrate holders.

12 Claims, 7 Drawing Sheets

(51) Int. Cl.

| | |
|---|---|
| ***H10P 72/76*** | (2026.01) |
| ***H10P 74/00*** | (2026.01) |
| ***H10P 95/90*** | (2026.01) |

(56) References Cited

U.S. PATENT DOCUMENTS

| | | | | |
|---|---|---|---|---|
| 8,420,981 | B2 * | 4/2013 | Goodman | H01L 21/67109 219/385 |
| 9,793,145 | B2 * | 10/2017 | Ranish | H01L 21/67115 |
| 2008/0223825 | A1 * | 9/2008 | Onishi | H01L 21/67126 156/345.37 |
| 2013/0010460 | A1 * | 1/2013 | Peil | F21K 9/00 362/249.06 |
| 2013/0193132 | A1 * | 8/2013 | Serebryanov | F27B 17/0025 219/385 |
| 2015/0075748 | A1 * | 3/2015 | Suzuki | H01L 21/68771 165/80.5 |
| 2017/0200618 | A1 * | 7/2017 | Hada | H01L 21/02049 |
| 2018/0061683 | A1 * | 3/2018 | Parkhe | G02B 6/32 |
| 2023/0005798 | A1 * | 1/2023 | Saito | G01J 1/02 |

FOREIGN PATENT DOCUMENTS

| | | | |
|---|---|---|---|
| JP | 2017-126734 | A | 7/2017 |
| JP | 2017-130518 | A | 7/2017 |
| KR | 10-2019-0009701 | A | 1/2019 |

* cited by examiner

HEATING/COOLING DEVICE AND HEATING/COOLING METHOD

CROSS-REFERENCE TO RELATED APPLICATIONS

The present application is a U.S. National Stage Entry of International Patent Application No. PCT/JP2020/030196, filed Aug. 6, 2020, which claims the benefit of priority to Japanese Patent Application No. 2019-184004, filed Oct. 4, 2019, each of which is hereby incorporated herein by reference in its entirety.

TECHNICAL FIELD

The present disclosure relates to a heating/cooling device and a heating/cooling method.

BACKGROUND

Patent Document 1 discloses a processing system including a COR process apparatus that performs a COR process on a substrate and a PHT process apparatus that performs a PHT process on a substrate. The PHT process apparatus includes a stage on which two substrates are placed in a horizontal state, and the stage is provided with a heater. The substrates subjected to the COR process by this heater are heated to perform the PHT process for vaporizing (sublimating) a reaction product produced by the COR process.

PRIOR ART DOCUMENTS

Patent Documents

Patent Document 1: Japanese Patent No. 5352103

A technique according to the present disclosure efficiently performs a substrate heating process and a substrate cooling process.

SUMMARY

An aspect of the present disclosure is a heating/cooling apparatus including: a chamber; a plurality of substrate holders provided inside the chamber, each of the substrate holders being configured to hold a substrate; a plurality of LED light sources provided outside the chamber and corresponding to the plurality of substrate holders, respectively, wherein each LED light source is configured to irradiate the substrate held by the substrate holder corresponding thereto with LED light, and the LED light has a wavelength that heats the substrate; a plurality of transmission windows provided between the plurality of substrate holders and the plurality of LED light sources and corresponding to the plurality of LED light sources, respectively, wherein each transmission window is configured to transmit the LED light radiated from the LED light source corresponding thereto; and a plurality of gas distribution parts provided inside the chamber and corresponding to the plurality of substrate holders, respectively, wherein each gas distribution part is configured to distribute and supply a cooling gas to the substrate held by the substrate holder corresponding thereto.

According to the present disclosure, it is possible to efficiently perform a substrate heating process and a substrate cooling process.

DETAILED DESCRIPTION

Figure 1:
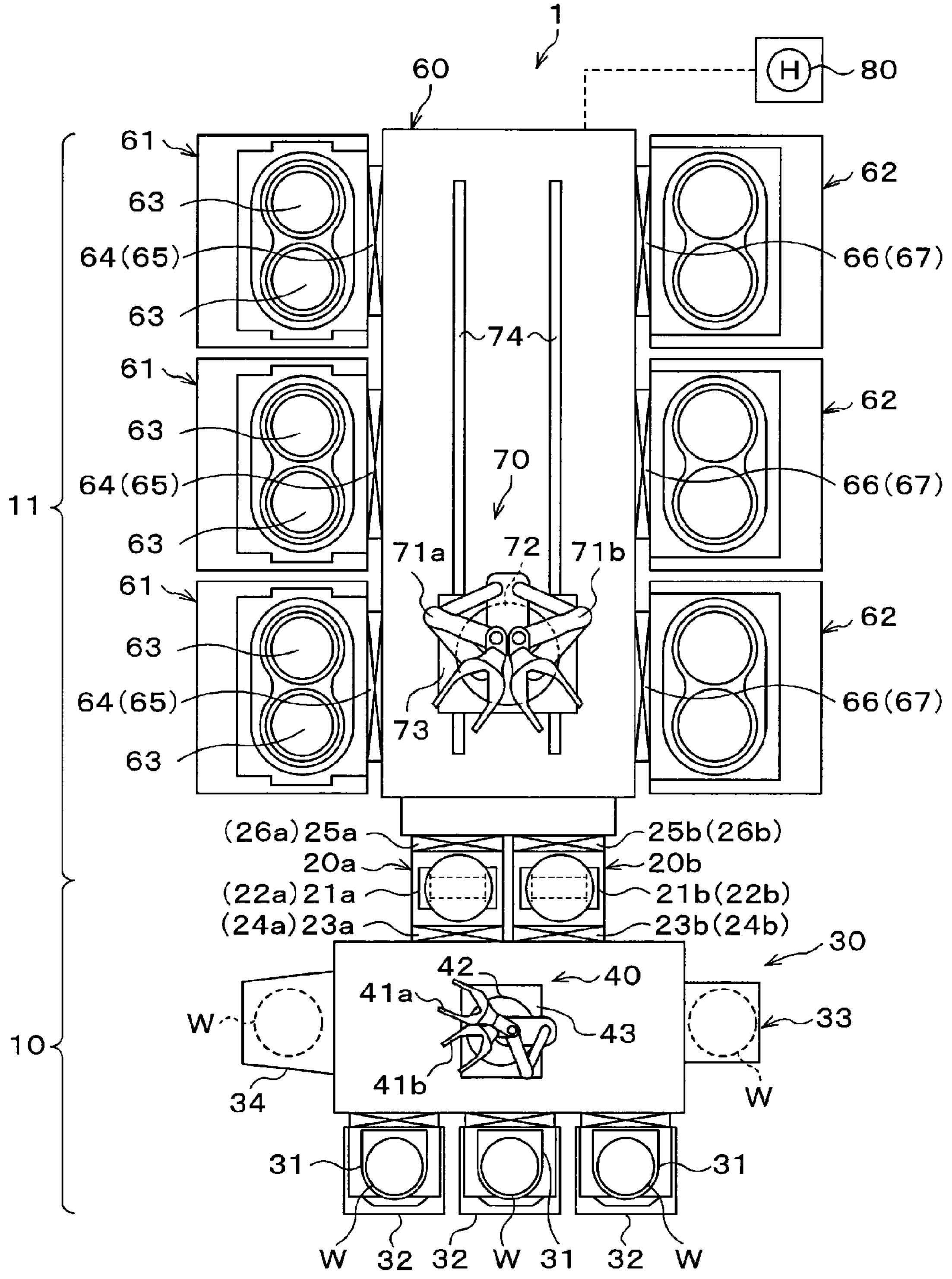
FIG. 1 is a plan view illustrating an outline of the configuration of a wafer processing apparatus according to an embodiment.

In a semiconductor device manufacturing process, a step of etching and removing an oxide film formed on the surface of a semiconductor wafer (hereinafter, may be referred to as a "wafer") is performed. For example, as disclosed in Patent Document 1, a step of etching an oxide film is performed by a chemical oxide removal (COR) process and a post-heat treatment (PHT) process.

The COR process is a process for reacting an oxide film formed on a wafer with a processing gas to change the oxide film to generate a reaction product. The PHT process is a heating process that heats and vaporizes a reaction product produced in the COR process. By continuously performing the COR process and the PHT process, etching of an oxide film formed on a wafer is performed.

Here, the wafer heating temperature in the PHT process is, for example, about 300 degrees C. In the conventional PHT process apparatus described in Patent Document 1, a wafer is heated by a heater embedded in a stage, and the heating rate is, for example, about 0.45 degrees C./sec. Therefore, the wafer heating process takes time.

In the conventional PHT process apparatus, the wafer subjected to heat treatment is naturally cooled to a temperature at which the wafer can be held by a transport arm. This cooling rate is, for example, about 0.5 degrees C./sec, which also takes time. Therefore, there is room for improvement in the conventional PHT process.

The technique according to the present disclosure efficiently performs a substrate heating process and a substrate cooling process. Hereinafter, the wafer processing apparatus and the wafer processing method according to the present embodiment will be described with reference to the drawings. In this specification and the drawings, elements having substantially the same functional configurations will be denoted by the same reference numerals and redundant descriptions will be omitted.

Wafer Processing Apparatus

First, the configuration of a wafer processing apparatus according to the present embodiment will be described. FIG. 1 is a plan view illustrating an outline of the configuration of a wafer processing apparatus 1 according to the present embodiment. In the present embodiment, the case in which the wafer processing apparatus 1 includes various processing modules for performing a COR process, a PHT process, a cooling storage (CST) process, and an orienting process on a wafer W as a substrate will be described as an example. In addition, the module configuration of the wafer processing apparatus 1 of the present disclosure is not limited thereto and may be arbitrarily selected.

As illustrated in FIG. 1, the wafer processing apparatus 1 includes a configuration in which an atmospheric part 10 and a pressure-reduced part 11 are integrally connected to each other via load-lock modules 20*a* and 20*b*. The atmospheric part 10 includes a plurality of atmospheric modules configured to perform desired processes on wafers W under an atmospheric atmosphere. The pressure-reduced part 11 includes a plurality of pressure-reduced modules configured to perform desired processes on wafers W under a pressure-reduced atmosphere.

The load-lock module 20*a* temporarily holds a wafer W, which is transported from a loader module 30 to be described later in the atmospheric part 10, in order to deliver the wafer W to a transfer module 60 to be described later in the pressure-reduced part 11. The load-lock module 20*a* includes an upper stocker 21*a* and a lower stocker 22*a* that hold two wafers W in the vertical direction.

The load-lock module 20*a* is connected to a loader module 30, which will be described later, through a gate 24*a* provided with a gate valve 23*a*. With the gate valve 23*a*, both security of airtightness and communication between the load-lock module 20*a* and the loader module 30 are achieved in a compatible manner. The load-lock module 20*a* is connected to the transfer module 60 to be described later through a gate 26*a* provided with a gate valve 25*a*. With the gate valve 25*a*, both security of airtightness and communication between the load-lock module 20*a* and the transfer module 60 are achieved in a compatible manner.

A gas supply part (not illustrated) configured to supply a gas and an exhaust part (not illustrated) configured to discharge the gas are connected to the load-lock module 20*a*, and the interior of the load-lock module 20*a* is configured to be switchable between an atmospheric atmosphere and a pressure-reduced atmosphere by the gas supply part and the exhaust part. That is, the load-lock module 20*a* is configured such that a wafer W can be appropriately delivered between the atmospheric part 10 having the atmospheric atmosphere and the pressure-reduced part 11 having the pressure-reduced atmosphere.

The load-lock module 20*b* has the same configuration as the load-lock module 20*a*. That is, the load-lock module 20*b* includes an upper stocker 21*b*, a lower stocker 22*b*, a gate valve 23*b* and a gate 24*b* on the loader module 30 side, and a gate valve 25*b* and a gate 26*b* on the transfer module 60 side.

The number and arrangement of load-lock modules 20*a* and 20*b* are not limited to those of the present embodiment, and may be arbitrarily set.

The atmospheric part 10 includes a loader module 30 including a wafer transport mechanism 40, which will be described later, a load port 32 in which a FOUP 31 capable of storing a plurality of wafers W is placed, a CST module 33 configured to cool a wafer W, and an orienter module 34 configured to adjust the horizontal orientation of a wafer W.

The loader module 30 includes a rectangular housing therein, and the interior of the housing is maintained in an atmospheric atmosphere. A plurality of (e.g., three) load ports 32 are arranged side by side on one side surface forming a long side of the housing of the loader module 30. The load-lock modules 20*a* and 20*b* are arranged side by side on the other side surface forming another long side of the housing of the loader module 30. The CST module 33 is provided on one side surface forming a short side of the housing of the loader module 30. The orienter module 34 is provided on the other side surface forming a short side of the housing of the loader module 30.

The number and arrangement of load ports 32, CST modules 33, and orienter modules 34 are not limited to those in the present embodiment, and may be arbitrarily designed.

The FOUP 31 accommodates a plurality of (e.g., 25) wafers per lot stacked in a plurality of stages at equal intervals. In addition, the interiors of the FOUPs 31 placed in respective load ports 32 are filled with, for example, air or nitrogen gas, and sealed.

The CST module 33 is capable of accommodating a plurality of wafers W (the number of which is, for example, equal to or greater than the number of wafers W accommodated in the FOUP 31) in a plurality of stages at equal intervals, and performs a cooling process on the plurality of wafers W.

The orienter module 34 rotates a wafer W to adjust the orientation of the same in the horizontal direction. Specifically, the orienter module 34 is adjusted such that the orientation from a reference position (e.g., a notch position) in the horizontal direction is the same for each wafer processing when the wafer processing is performed on each of a plurality of wafers W.

Inside the loader module 30, a wafer transport mechanism 40 configured to transport wafers W is provided. The wafer transport mechanism 40 includes transport arms 41*a* and 41*b* configured to hold and move the wafers W, a turntable 42 configured to rotatably support the transport arms 41*a* and 41*b*, and a rotary stage 43 on which the turntable 42 is mounted. The wafer transport mechanism 40 is configured to be movable in the longitudinal direction inside the housing of the loader module 30.

The pressure-reduced part 11 includes a transfer module 60 configured to simultaneously transport two wafers W, a COR module 61 configured to perform a COR process on the wafers W transported from the transfer module 60, and a PHT module 62 configured to perform a PHT process on the wafers W. The interior of each of the transfer module 60, the COR module 61, and PHT module 62 is maintained in a pressure-reduced atmosphere. For the transfer module 60, a plurality of (e.g., three) COR modules 61 and PHT modules 62 are provided.

The transfer module 60 has a housing with a rectangular interior and is connected to the load-lock modules 20*a* and 20*b* through the gate valves 25*a* and 25*b*, as described above. The transfer module 60 sequentially transports the wafers W carried into the load-lock module 20*a* to one COR module 61 and one PHT module 62 to be subjected to the COR process and the PHT process, and then carries out the wafers W to the atmospheric part 10 via the load-lock module 20*b*.

Inside the COR module 61, two stages 63 on which two wafers W are placed side by side in the horizontal direction are provided. The COR module 61 simultaneously performs the COR process on the two wafers W by placing the wafers W side by side on the stages 63. In addition, the COR module 61 is connected to a gas supply part (not illustrated) configured to supply a processing gas, a purge gas, or the like, and an exhaust part (not illustrated) configured to discharge the gas.

The COR module 61 is connected to the transfer module 60 through a gate 65 provided with a gate valve 64. With this gate valve 64, both security of airtightness and communication between the transfer module 60 and the COR module 61 are achieved in a compatible manner.

Inside the PHT module 62, two buffers 101*a* and 101*b* to be described later on which two wafers W are placed side by side in the horizontal direction are provided. The PHT module 62 simultaneously performs the PHT process on two wafers W by placing the wafers W side by side on the buffers 101*a* and 101*b*. The specific configuration of the PHT module 62 will be described later.

The PHT module 62 is connected to the transfer module 60 through a gate 67 provided with a gate valve 66. With this gate valve 66, both security of airtightness and communication between the transfer module 60 and the PHT module 62 are achieved in a compatible manner.

Inside the transfer module 60, a wafer transport mechanism 70 configured to transport wafers W is provided. The wafer transport mechanism 70 includes transport arms 71*a* and 71*b* configured to hold and move two wafers W, a turntable 72 configured to rotatably support the transport arms 71*a* and 71*b*, and a rotary stage 73 on which the turntable 72 is mounted. In addition, inside the transfer module 60, guide rails 74, which extend in the longitudinal direction of the transfer module 60, are provided. The rotary stage 73 is provided on the guide rails 74, and the wafer transport mechanism 70 is configured to be movable along the guide rails 74.

In the transfer module 60, the two wafers W held by the upper stocker 21*a* and the lower stocker 22*a* in the load-lock module 20*a* are received by the transport arm 71*a* and transported to the COR module 61. The two wafers W subjected to the COR process are held by the transport arm 71*a* and transported to the PHT module 62. In addition, the two wafers W subjected to the PHT process are held by the transport arm 71*b*, and are carried out to the load-lock module 20*b*.

The wafer processing apparatus 1 described above is provided with a controller 80. The controller 80 is a computer including, for example, a CPU and a memory, and includes a program storage part (not illustrated). The program storage part stores programs for controlling processing of a wafer W in the wafer processing apparatus 1. The program storage part also stores programs for controlling the operations of the drive system of various processing modules or transport mechanisms described above in order to implement wafer processing to be described later in the wafer processing apparatus 1. The programs may be recorded in a computer-readable storage medium H, and may be installed on the controller 80 from the storage medium H.

Operation of Wafer Processing Apparatus

The wafer processing apparatus 1 according to the present embodiment is configured as described above. Next, wafer processing in the wafer processing apparatus 1 will be described.

First, a FOUP 31 containing a plurality of wafers W is placed in a load port 32.

Next, two wafers W are taken out from the FOUP 31 by the wafer transport mechanism 40 and transported to the orienter module 34. In the orienter module 34, the orientation of the wafers W in the horizontal direction from a reference position (e.g., the notch position) is adjusted (an orienting process).

Next, the two wafers W are carried into the load-lock module 20*a* by the wafer transport mechanism 40. When the two wafers W are carried into the load-lock module 20*a*, the gate valve 23*a* is closed, and the interior of the load-lock module 20*a* is sealed and pressure-reduced. Thereafter, the gate valve 25*a* is opened, and the interior of the load-lock module 20*a* and the interior of the transfer module 60 communicate with each other.

Next, when the load-lock module 20*a* and the transfer module 60 communicate with each other, the two wafers W are held by the transport arm 71*a* of the wafer transport mechanism 70, and are carried into the transfer module 60 from the load-lock module 20*a*. Subsequently, the wafer transport mechanism 70 moves to the front of one COR module 61.

Next, the gate valve 64 is opened, and the transport arm 71*a* holding the two wafers W enters the COR module 61. Then, the two wafer W are placed on the stages 63 from the transport arm 71*a*, respectively. Thereafter, the transport arm 71*a* exits from the COR module 61.

Next, after the transport arm 71*a* exits from the COR module 61, the gate valve 64 is closed, and the COR module 61 performs the COR process on the two wafers W. In the COR process, a processing gas is supplied to the surface of an oxide film so that the oxide film and the processing gas are chemically reacted, and the oxide film is changed to produce a reaction product. For example, hydrogen fluoride gas and ammonia gas are used as the processing gas, and ammonium fluorosilicate (AFS) is produced as a reaction product.

Next, when the COR process in the COR module 61 is terminated, the gate valve 64 is opened, and the transport arm 71*a* enters the COR module 61. Then, the two wafers W are delivered from the stages 63 to the transport arm 71*a*, and the two wafers W are held by the transport arm 71*a*. Thereafter, the transport arm 71*a* exits from the COR module 61, and the gate valve 64 is closed.

Next, the wafer transport mechanism 70 moves to the front of a PHT module 62. Next, the gate valve 66 is opened, and the transport arm 71*a* holding the two wafers W enters the PHT module 62. Then, the wafers W are placed on each of the buffers 101*a* and 101*b* from the transport arm 71*a*. Thereafter, the transport arm 71*a* exits from the PHT module 62. Subsequently, the gate valve 66 is closed, and the PHT process is performed on the two wafers W. The specific process of this PHT process will be described later.

Next, when the PHT process on the wafers W is terminated, the gate valve 66 is opened, and the transport arm 71*b* enters the PHT module 62. Then, the two wafers W are delivered from the stages 64*a* and 64*b* to the transport arm 71*b*, and the two wafers W are held by the transport arm 71*b*. Thereafter, the transport arm 71*b* exits from the PHT module 62, and the gate valve 66 is closed.

Thereafter, the gate valve 25*b* is opened, and the two wafers W are carried into the load-lock module 20*b* by the wafer transport mechanism 70. After the wafers W are carried into the load-lock module 20*b*, the gate valve 25*b* is closed, and the interior of the load-lock module 20*b* is sealed and opened to the atmosphere.

Next, the two wafers W are transported to the CST module 33 by the wafer transport mechanism 40. In the CST module 33, the wafers W are subjected to the CST process, and the wafers W are cooled.

Next, the two wafers W are returned to and accommodated in the FOUP 31 by the wafer transport mechanism 40. In this way, a series of wafer processes in the wafer processing apparatus 1 are completed.

PHT Module

Figure 2:
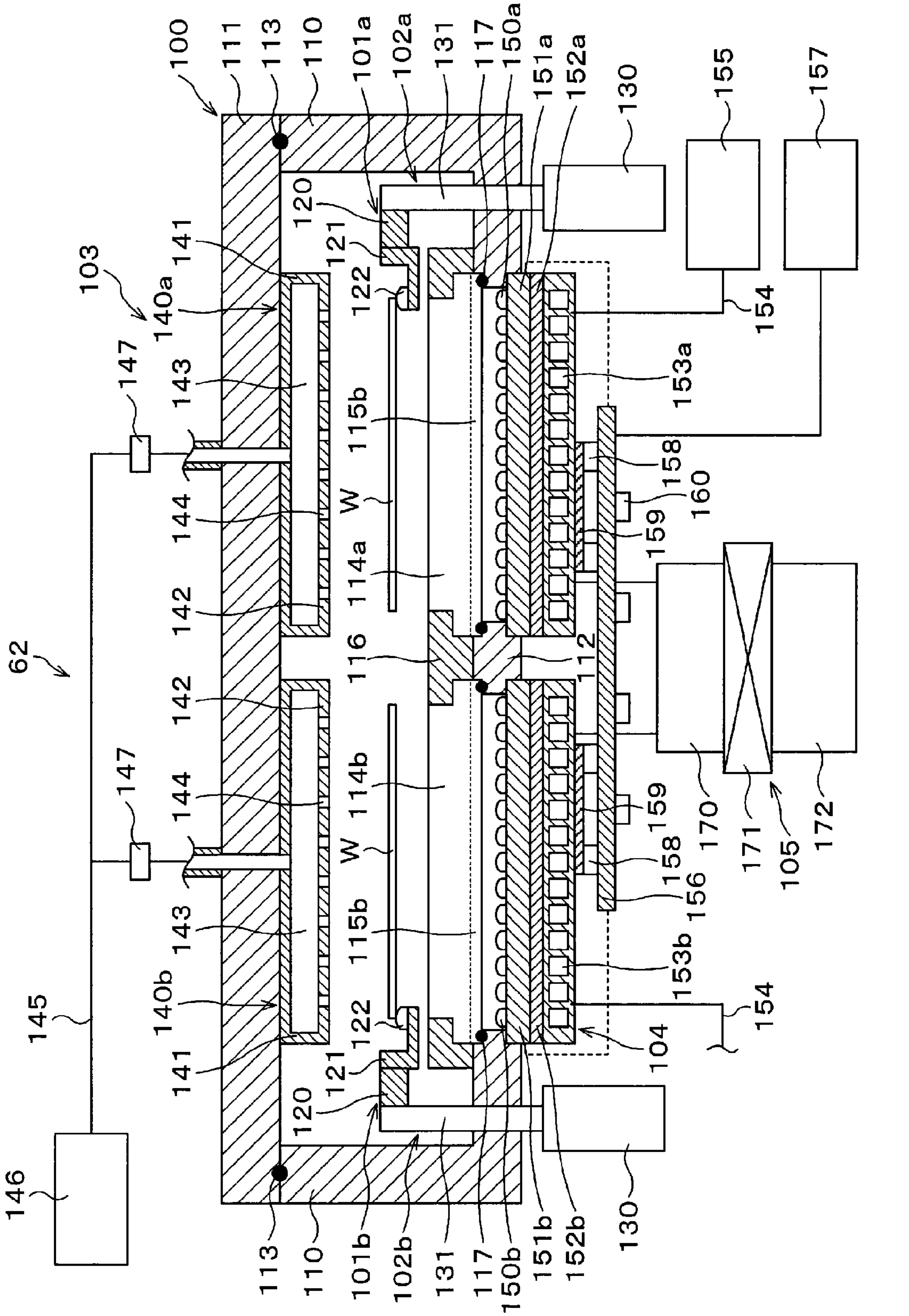
FIG. 2 is a vertical cross-sectional view illustrating an outline of the configuration of a PHT module.
Figure 3:
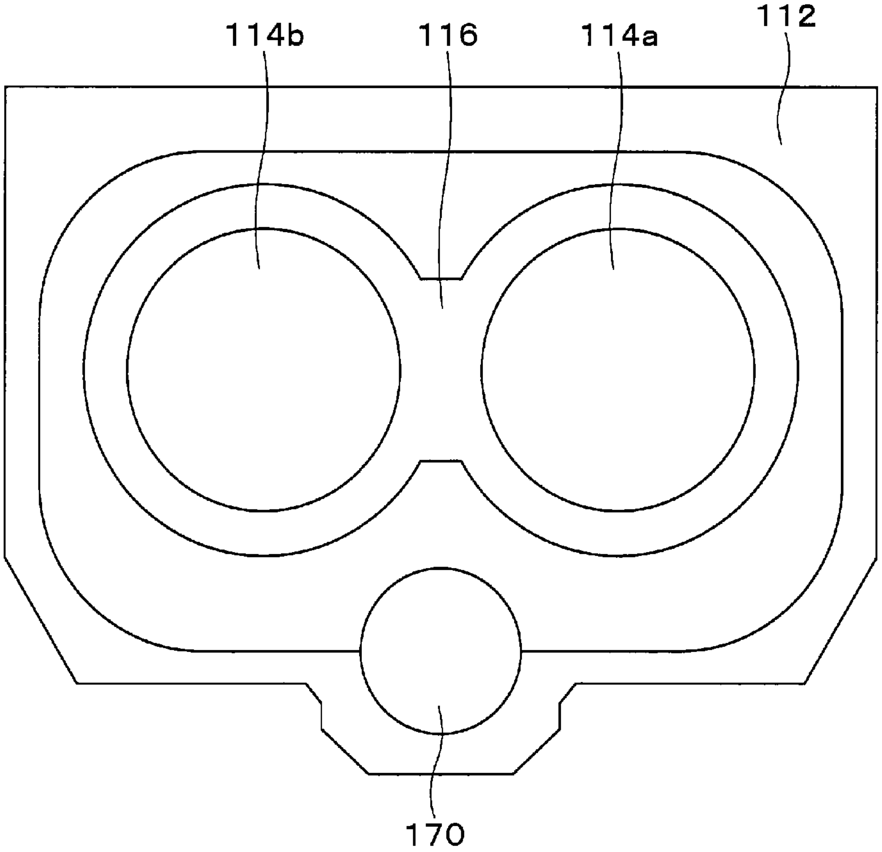
FIG. 3 is a plan view illustrating an outline of the configuration of a PHT module.

Next, the configuration of the PHT module 62 as a heating/cooling device will be described. FIG. 2 is a vertical sectional view illustrating an outline of the configuration of the PHT module 62. FIG. 3 is a plan view illustrating an outline of the internal configuration of the PHT module 62. In the PHT module 62 of the present embodiment, a process is performed on a plurality of wafers W, for example, two wafers W.

The PHT module 62 includes an airtightly configured chamber 100, buffers 101*a* and 101*b* as substrate holders configured to hold a plurality of (e.g., two in the present embodiment) wafers W inside the chamber 100, lifting mechanisms 102*a* and 102*b* as two moving mechanisms configured to raise and lower the buffers 101*a* and 101*b*, respectively, a gas supply part 103 configured to supply a gas into the chamber 100, a heating part 104 configured to heat the wafers W held on the buffers 101*a* and 101*b*, and an exhaust part 105 configured to discharge the gas inside the chamber 100.

The chamber 100 is, for example, a substantially rectangular parallelepiped container as a whole, which is made of a metal such as aluminum or stainless steel. The chamber 100 has, for example, a substantially rectangular shape in a plan view, and includes a cylindrical side wall 110 having open top and bottom surfaces, a ceiling plate 111 that hermetically covers the top surface of the side wall 110, and a bottom plate 112 that covers the bottom surface of the side wall 110. A sealing member 113 that airtightly maintains the interior of the chamber 100 is provided between the upper end surface of the side wall 110 and the ceiling plate 111. Further, each of the side wall 110, the ceiling plate 111, and the bottom plate 112 is provided with a heater (not illustrated), and the side wall 110, the ceiling plate 111, and the bottom plate 112 are heated to, for example, 100 degrees C. or higher by the heaters to suppress the adhesion of sublimated AFS and other deposits.

The bottom plate 112 is partially opened, and transmission windows 114*a* and 114*b* are fitted in opening portions. The transmission windows 114*a* and 114*b* are provided between the buffers 101*a* and 101*b* and LED light sources 150*a* and 150*b* to be described later, and are configured to transmit the LED light from the LED light sources 150*a* and 150*b*. The material of the transmission windows 114*a* and 114*b* is not particularly limited as long as it transmits LED light, but, for example, quartz is used. As will be described later, the LED light sources 150*a* and 150*b* are provided to correspond to the two buffers 101*a* and 101*b*, and the two transmission windows 114*a* and 114*b* are provided to correspond to the two LED light sources 150*a* and 150*b*.

On the bottom surfaces of the transmission windows 114*a* and 114*b*, for example, heating plates 115*a* and 115*b* each having a built-in heater (not illustrated) are provided. The heating plates 115*a* and 115*b* are configured to transmit the LED light from the LED light sources 150*a* and 150*b*. The material of the heating plates 115*a* and 115*b* is not particularly limited as long as it transmits LED light, but for example, heaters in which a heating wire and conductive substance are attached to transparent quartz are used. By heating the transmission windows 114*a* and 114*b* to, for example, 100 degrees C. or higher with the heating plates 115*a* and 115*b*, it is possible to suppress the adhesion of deposits to the transmission windows 114*a* and 114*b* and to suppress blurring of the transmission windows 114*a* and 114*b*.

The transmission windows 114*a* and 114*b* are supported by a support member 116 provided on the top surface of the bottom plate 112. Sealing members 117 that maintain the interior of the chamber 100 airtightly are provided between the bottom plate 112 and the transmission windows 114*a* and 114*b* (heating plates 115*a* and 115*b*).

Figure 4:
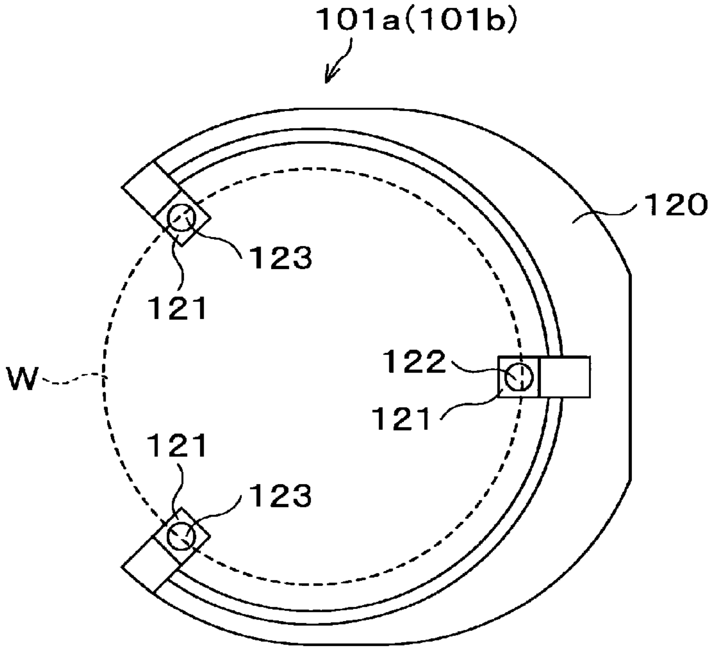
FIG. 4 is a plan view illustrating an outline of the configuration of a buffer.

Two buffers 101*a* and 101*b* are provided inside the chamber 100, and each buffer 101*a* and 101*b* holds a wafer W. The buffers 101*a* and 101*b* each has an arm member 120 configured in a substantially C shape as illustrated in FIG. 4. The arm member 120 is curved along the peripheral edge of the wafer W with a radius of curvature larger than the diameter of the wafer W. The arm member 120 is provided with holding members 121 protruding inward from the arm member 120 and holding the outer peripheral portion of the rear surface of the wafer W at a plurality of locations, for example, three locations. Each holding member 121 is configured to transmit the LED light from the LED light sources 150*a* and 150*b*. The material of the holding member 121 is not particularly limited as long as it transmits the LED light, but, for example, quartz is used. As described in Patent Document 1, when a wafer W is placed on a conventional aluminum stage, for example, an aluminum component may be transferred to the rear surface of the wafer W, so that metal contamination may occur on the rear surface of the wafer W. In this respect, in the present embodiment, since the outer peripheral portion of the rear surface of the wafer W is held, metal contamination can be suppressed.

Among the three holding members 121, one holding member 121 is provided with a temperature measuring pin 122 as a temperature measuring part that comes into contact with the rear surface of the wafer W and measures the temperature of the wafer W. For example, a thermocouple is provided inside the temperature measuring pin 122 to measure the temperature of the wafer W. The temperature measuring pin 122 is configured to transmit the LED light from the LED light sources 150*a* and 150*b*. The material of the temperature measuring pin 122 is not particularly limited as long as it transmits LED light, but for example, sapphire is used for the portion that comes into contact with the rear surface of the wafer W, and quartz is used for the portion including therein the thermocouple.

In the present embodiment, a contact type temperature measuring pin 122 is used to measure the temperature of the wafer W, but the temperature measuring part is not limited to this. For example, as the temperature measuring part, a non-contact type temperature sensor may be used, or an indirect type temperature measuring part may be used. For the non-contact type temperature sensor, for example, a radiation thermometer is used and is provided outside the ceiling plate 111. The temperature of the wafer W is measured from above by this non-contact type temperature sensor. The indirect temperature measuring part includes a heated object made of silicon, which is the same material as the wafer W, and a sheathed thermocouple. The heated object is also irradiated with the LED light radiated to the wafer W, and the temperature of the heated object is measured by a sheathed thermocouple, whereby the temperature of the wafer W is obtained by conversion.

Of the three holding members 121, the remaining two holding members 121 are provided with support pins 123 that hold the wafer W. The support pins 123 simply support the wafer W and do not include therein a thermocouple unlike the temperature measuring pin 122. The support pins 123 are configured to transmit the LED light from the LED light sources 150*a* and 150*b*. The material of the support pins 123 is not particularly limited as long as it transmits LED light, but, for example, quartz is used.

Two lifting mechanisms 102*a* and 102*b* are provided, and the lifting mechanism 102*a* and 102*b* raises and lowers the buffers 101*a* and 101*b*, respectively. As illustrated in FIG. 2, the lifting mechanisms 102*a* and 102*b* include respectively buffer drive parts 130 provided outside the chamber 100, and drive shafts 131 configured to support the arm members 120 of the buffers 101*a* and 101*b* and connected to the buffer drive parts 130, wherein the drive shafts 131 penetrate the bottom plate 112 of the chamber 100 and extend inside the chamber 100 vertically upward. For the buffer drive parts 130, for example, actuators driven by a motor driver (not illustrated) are used. The lifting mechanisms 102*a* and 102*b* may dispose the buffers 101*a* and 101*b* at arbitrary height positions by raising and lowering the drive shafts 131 by the buffer drive parts 130. As a result, as will be described later, the position where a heating process is performed on a wafer W and the position where a cooling process is performed on a wafer W can be appropriately adjusted.

The gas supply part 103 supplies gases (a cooling gas and a purge gas) into the chamber 100. The gas supply part 103 includes shower heads 140*a* and 140*b* as gas distribution parts that distribute and supply gas into the chamber 100. Two shower heads 140*a* and 140*b* are provided on the bottom surface of the ceiling plate 111 of the chamber 100 to correspond to the buffers 101*a* and 101*b*. For example, each of the shower heads 140*a* and 140*b* includes a substantially cylindrical frame body 141 having an opened bottom surface and supported on the bottom surface of the ceiling plate 111, and a substantially disk-shaped shower plate 142 fitted to the inner surface of the frame body 141. The shower plate 142 is provided at a desired distance from the ceiling portion of the frame body 141. As a result, a space 143 is formed between the ceiling portion of the frame body 141 and the top surface of the shower plate 142. The shower plate 142 is provided with a plurality of openings 144 penetrating the same in the thickness direction.

A gas source 146 is connected to the space 143 between the ceiling portion of the frame body 141 and the shower plate 142 via a gas supply pipe 145. The gas source 146 is configured to be capable of supplying, for example, $N_2$ gas or Ar gas, as a cooling gas or a purge gas. Therefore, the gas supplied from the gas source 146 is supplied toward the wafers W held on the buffers 101*a* and 101*b* via the space 143 and the shower plates 142. In addition, the gas supply pipe 145 is provided with flow rate adjustment mechanisms 147 configured to adjust the supply amount of gas so as to be capable of individually adjusting the amount of the gas to be supplied to each wafer W.

The heating parts 104 heat the wafers W held on the buffers 101*a* and 101*b*. The heating part 104 includes two LED light sources 150*a* and 150*b* provided outside the chamber 100, and LED mounting boards 151*a* and 151*b* on the surfaces of which the LED light sources 150*a* and 150*b* are mounted. The LED mounting boards 151a and 151*b* are provided so as to be fitted to the lower portion of the bottom plate 112 of the chamber 100, and the LED light sources 150*a* and 150*b* are disposed below the transmission windows 114*a* and 114*b*. That is, the LED light sources 150*a* and 150*b* are provided to correspond to the buffers 101*a* and 101*b*, the shower heads 140*a* and 140*b*, and the transmission windows 114*a* and 114*b*, respectively. The LED light emitted from the LED light sources 150*a* and 150*b* passes through the transmission windows 114*a* and 114*b* so that the wafers W held on the buffers 101*a* and 101*b* are irradiated with the LED light. The LED light heats the wafers W to a desired temperature.

The LED light has a wavelength that is transmitted through the transmission windows 114*a* and 114*b* made of quartz and absorbed by the wafers W made of silicon. Specifically, the wavelength of the LED light is, for example, 400 nm to 1,100 nm, more preferably 800 nm to 1,100 nm, and 855 nm in the present embodiment.

On the rear surfaces of the LED mounting boards 151*a* and 151*b*, cooling plates 153*a* and 153*b* for cooling the LED light sources 150*a* and 150*b* are provided via heat transfer sheets 152*a* and 152*b*. Since a minute gap is formed between the LED mounting boards 151*a* and 151*b* and the cooling plates 153*a* and 153*b*, heat transfer sheets 152*a* and 152*b* are provided to improve heat transfer. For example, cooling water flows inside the cooling plates 153*a* and 153*b* as a cooling medium. A cooling water source 155 configured to be capable of supplying the cooling water is connected to the cooling plates 153*a* and 153*b* via cooling water supply pipes 154, respectively.

Below the cooling plates 153*a* and 153*b*, an LED control board 156 that controls the LED light sources 150*a* and 150*b* is provided. The LED control board 156 is commonly provided to the two LED light sources 150*a* and 150*b*. An LED power supply 157 is connected to the LED control board 156. Components 158 that require cooling, such as FETs and diodes, are mounted on the front surface of the LED control board 156. These components 158 are provided on the cooling plates 153*a* and 153*b* via heat transfer pads 159. That is, the cooling plates 153*a* and 153*b* cool the components 158 in addition to the above-described LED light sources 150*a* and 150*b*. Components 160 that do not require cooling in the LED control board 156 are provided on the rear surface of the LED control board 156.

The exhaust part 105 includes an exhaust pipe 170 that discharges the gas inside the chamber 100. As illustrated in FIG. 3, the exhaust pipe 170 is disposed outside the transmission windows 114*a* and 114*b* in the bottom plate 112. Since the transmission windows 114*a* and 114*b* and the LED light sources 150*a* and 150*b* are provided below the wafers W, the exhaust pipe 170 is disposed at a position offset from the transmission windows 114*a* and 114*b*, the LED light sources 150*a* and 150*b*, or the like. As illustrated in FIG. 2, a pump 172 is connected to the exhaust pipe 170 via a valve 171. For the valve 171, for example, an automatic pressure control valve (an APC valve) is used. For the pump 172, for example, a turbo molecular pump (TMP) is used. When the pump 172 is used, the gas inside the chamber 100 can be forcibly discharged with a large pressure.

Operation of PHT Module

Figure 5A:
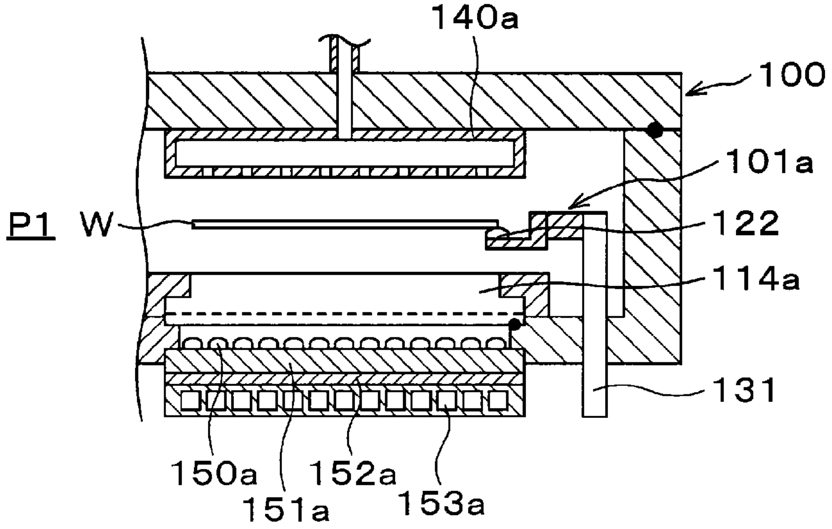
FIGS. 5A to 5C are explanatory views illustrating a state in which a PHT process is performed in a PHT module.
Figure 5B:
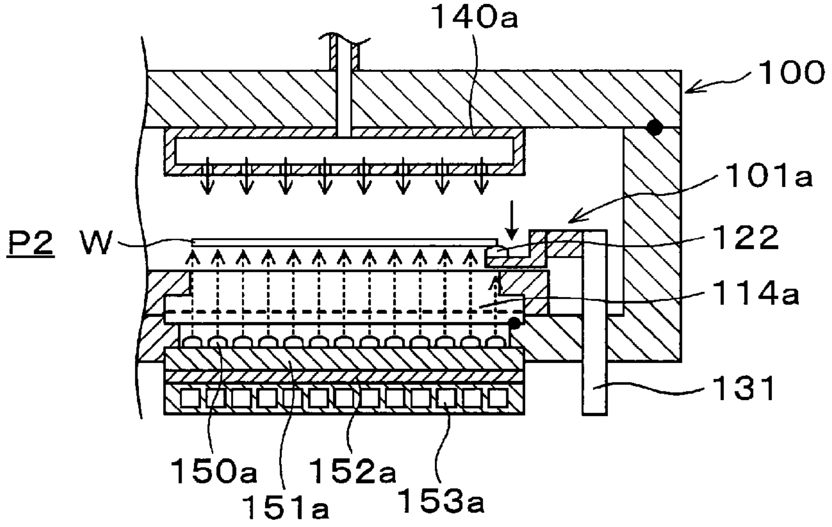
Figure 5C:
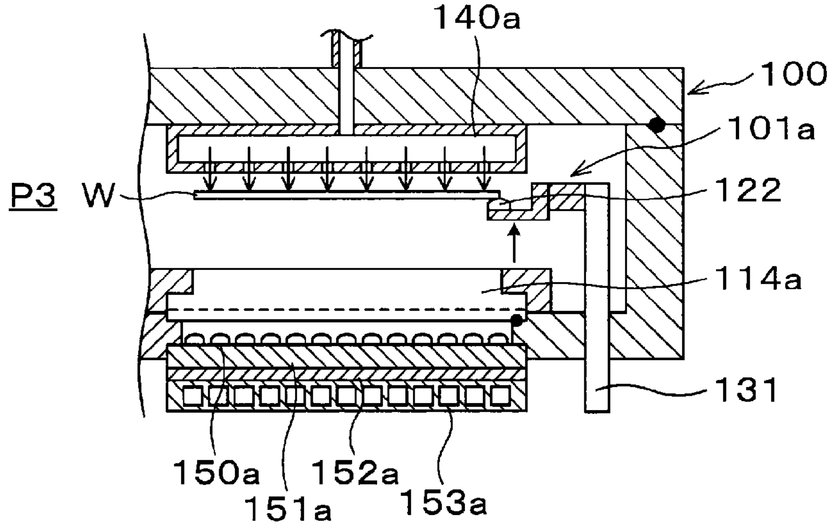

The PHT module 62 according to the present embodiment is configured as described above. Next, a PHT process (heating/cooling process) in the PHT module 62 will be described. FIGS. 5A to 5C are explanatory views illustrating a state in which a PHT process is performed in the PHT module 62. Although FIGS. 5A to 5C illustrate a half of the chamber 100 (e.g., the buffer 101*a*, the transmission window 114*a*, the shower head 140*a*, the LED light source 150*a*, and the like), that is, one wafer W, actually two wafers W are processed at the same time.

First, the gate valve 66 is opened, and, as illustrated in FIG. 5A, the wafer W is carried into the PHT module 62 at a transport position P1 and delivered from the transport arm 71*a* of the wafer transport mechanism 70 to the buffer 101*a*. Thereafter, the gate valve 66 is closed.

Next, as illustrated in FIG. 5B, the buffer 101*a* is lowered and the wafer W is disposed at a heating position P2. The heating position P2 is a position as close to the LED light source 150*a* as possible. For example, the distance between the wafer W and the LED light source 150*a* is 200 mm or less. Thereafter, the temperature of the wafer W is measured by the temperature measuring pin 122. As a result, the reference temperature of the wafer W is confirmed.

Next, the LED light source 150*a* is turned on. The LED light emitted from the LED light source 150*a* passes through the transmission window 114*a*, and the wafer W is irradiated with the LED light. As a result, the wafer W is heated to a desired heating temperature, for example 300 degrees C. (heating process). This heating temperature of 300 degrees C. is a temperature equal to or higher than the sublimation temperature of AFS on the wafer W, as will be described later. The heating rate is, for example, 12 degrees C./sec. In addition, the LED light source 150*a* controls the pulse of the LED light such that the temperature is within a predetermined range. The pulse width is, for example, 1 KHz to 500 KHz, and is 200 KHz in the present embodiment.

At this time, $N_2$ gas as a purge gas is supplied from the shower head 140*a* of the gas supply part 103. Then, the pressure inside the chamber 100 is adjusted to, for example, 0.1 Torr to 10 Torr. Since the $N_2$ gas from the shower head 140*a* is uniformly supplied from the plurality of openings 144, the gas flow inside the chamber 100 can be rectified.

At this time, the temperature of the wafer W is measured by the temperature measuring pin 122, and the LED light source 150*a* is feedback-controlled. Specifically, based on the temperature measurement result, the LED light emitted from the LED light source 150*a* is controlled such that the wafer W has a desired heating temperature.

Then, the temperature of the wafer W is maintained at 300 degrees C., and after a desired time elapses, the AFS on the wafer W is heated and vaporized (sublimated). Thereafter, the LED light source 150*a* is turned off. An end point detection method at this time is arbitrary, but may be monitored by, for example, a gas analyzer (e.g., OES, QMS, FT-IR, or the like), a film thickness meter, or the like.

Next, as illustrated in FIG. 5C, the buffer 101*a* is raised and the wafer W is disposed at a cooling position P3. The cooling position P3 is a position that is as close to the shower head 140*a* as possible. For example, the distance between the wafer W and the shower head 140*a* is 200 mm or less.

Subsequently, $N_2$ gas as a cooling gas is supplied from the shower head 140*a*, and the wafer W is cooled to a desired cooling temperature, for example, 180 degrees C. (cooling process). The cooling temperature of 180 degrees C. is a temperature at which the transport arm 71*b* of the wafer transport mechanism 70 is capable of holding the wafer W. The cooling rate is, for example, 11 degrees C./sec. Since the $N_2$ gas from the shower head 140*a* is uniformly supplied from the plurality of openings 144, the wafer W can be uniformly cooled.

From the heating process to the cooling process, the supply of $N_2$ gas from the shower head 140*a* is continued. However, the supply amount of $N_2$ gas in the cooling process step is, for example, 40 L/min, which is larger than the supply amount of $N_2$ gas in the heating process. However, the supply amount of $N_2$ gas depends on the volume of the chamber 100. In addition, the pressure inside the chamber 100 in the cooling process is 1 Torr to 100 Torr, which is higher than the pressure inside the chamber 100 in the heating process.

Thereafter, when the wafer W reaches the desired cooling temperature, the supply amount of $N_2$ gas in the cooling process is restored. The end point detection method at this time is arbitrary, but may be controlled by, for example, the cooling time, or the temperature of the wafer W may be measured by the temperature measuring pin 122.

Next, the buffer 101*a* is lowered, and the wafer W is disposed again at the transport position P1 as illustrated in FIG. 5A. Thereafter, the gate valve 66 is opened, and the wafer W is delivered from the buffer 101*a* to the transport arm 71*b* of the wafer transport mechanism 70. Then, the wafer W is carried out from the PHT module 62.

During the PHT process (heating/cooling process) in the PHT module 62, the interior of the chamber 100 is evacuated by the exhaust part 105. At this time, in a normal operation, the gas is exhausted by $N_2$ gas from the shower head 140*a*. However, the pump 172 may be operated to perform high-speed exhaust to shorten the exhaust time.

According to the above-described embodiment, in the heating process in the PHT module 62, since the LED light sources 150*a* and 150*b* are used, the heating rate (12 degrees C./sec) is faster than the heating rate (0.45 degrees C./sec) by the conventionally used heater. Therefore, since the wafer W heating process can be efficiently performed in a short time, the throughput of wafer processing can be improved.

In addition, in the cooling process in the PHT module 62, since the supply amount of the cooling gas from the shower heads 140*a* and 140*b* is set to a large flow rate, the cooling rate (11 degrees C./sec) is faster than the cooling rate of the conventional natural cooling (0.5 degrees C./sec). Therefore, since the cooling process of the wafer W can be efficiently performed in a short time, the throughput of wafer processing can be further improved.

Figure 6:
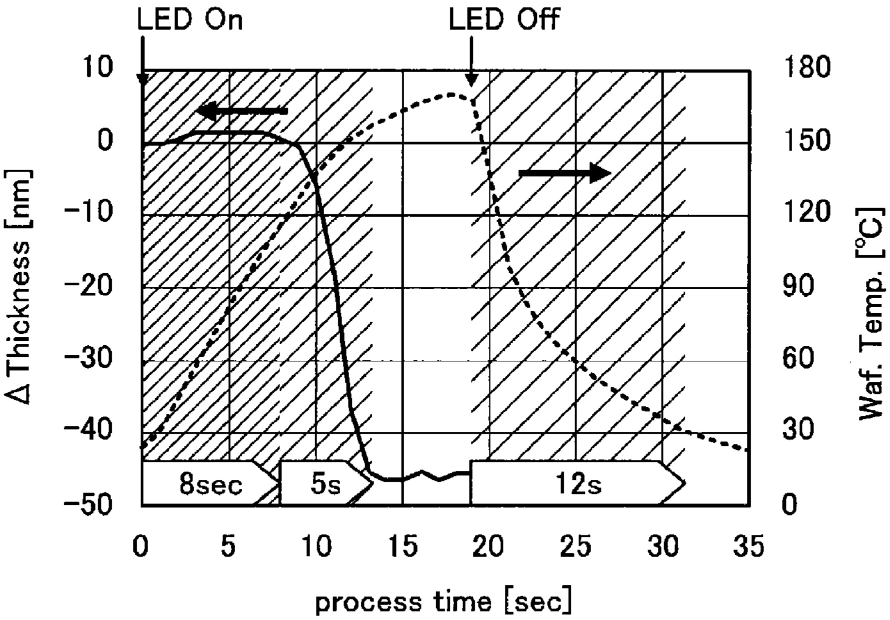
FIG. 6 is a graph showing experimental results obtained by performing a PHT process in a PHT module.

Specifically, the present inventors conducted an experiment, and the results shown in FIG. 6 were obtained. The horizontal axis of FIG. 6 represents a process time, the left vertical axis represents a thickness of a film on a wafer W (the thickness before the heating process is assumed as 0 nm), and the right vertical axis represents a temperature of the wafer W. As shown in FIG. 6, after the LED light sources 150*a* and 150*b* were turned on, the film thickness decreased by 40 nm in 13 seconds, and it was possible to sublimate AFS. In this respect, heating with a conventional heater takes more than 1 minute. In addition, it was possible to cool the temperature of the wafer W to a desired temperature in 12 seconds after the LED light sources 150*a* and 150*b* were turned off. In this respect, it takes more than 1 minute with the conventional natural cooling. Therefore, according to the present embodiment, it was found that each of the heating process and the cooling process can be performed in a short time.

In the PHT module 62 of the above embodiment, in principle, no black member is provided inside the chamber 100. However, for example, the arm members 120 of the buffers 101*a* and 101*b*, the drive shafts 131, and other members of which the temperature is intentionally raised by LED light may be black.

In the PHT module 62 of the above-described embodiment, the heating process and the cooling process may be repeated in order to prevent the temperature of the wafer W from rising too high. For example, when there is a resist film on the wafer W, it is possible to suppress the resist film from being damaged by adjusting the temperature of the wafer W.

In the PHT module 62 of the above-described embodiment, in the cooling process, the wafer W was cooled to a temperature at which the wafer W can be held by the transport arm 71*b* of the wafer transport mechanism 70, for example, 180 degrees C., but the cooling temperature of the wafer W is not limited to this. For example, the cooling temperature may be 80 degrees C., which is a temperature at which the COR process is possible. For example, when the COR process in the COR module 61 and the PHT process in the PHT module 62 are repeatedly performed (when a so-called multi-visit process is performed), the CST process can be omitted so that the throughput of wafer processing can be improved.

LED Light Source and LED Mounting Board

Figure 7A:
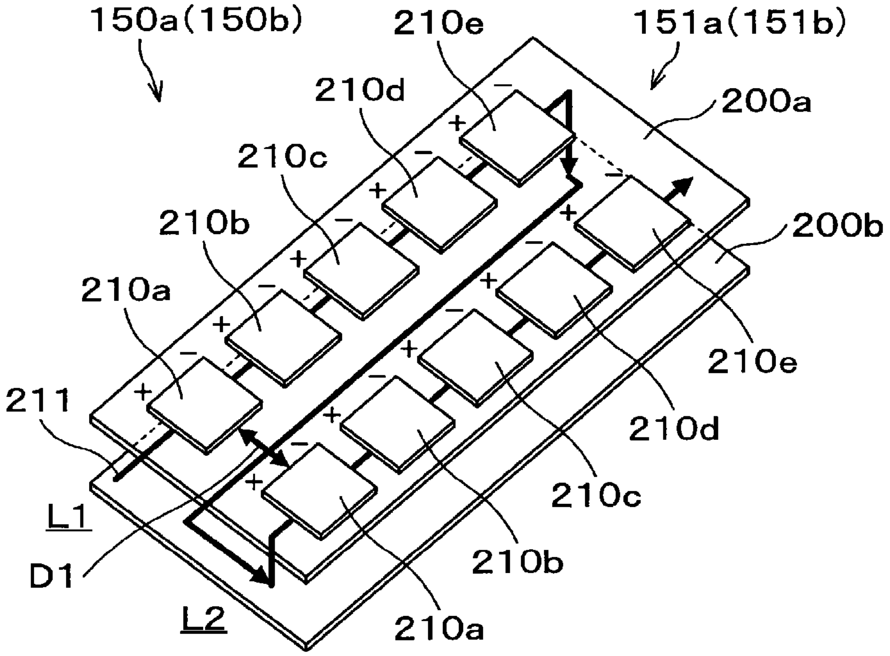
FIGS. 7A and 7B are explanatory views illustrating the configurations of an LED light source and an LED mounting board.
Figure 7B:
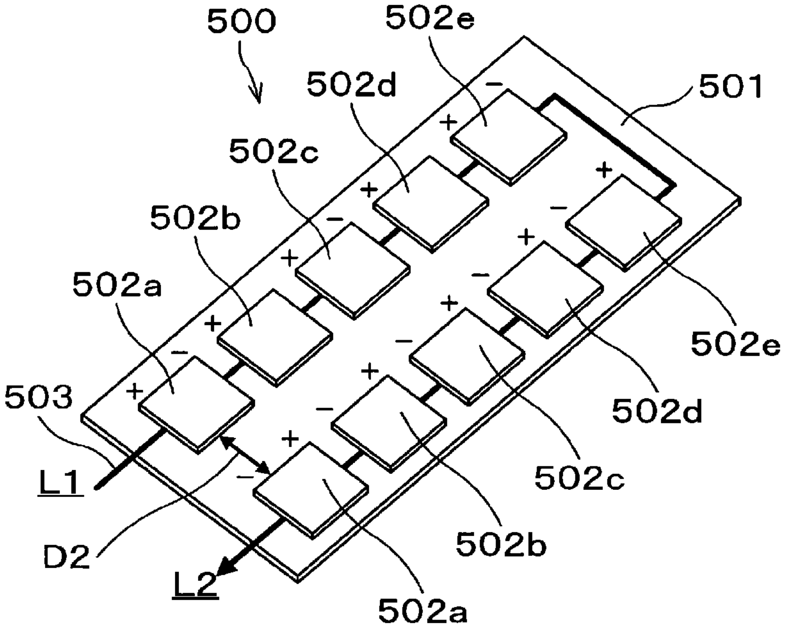

Next, the configurations of LED light sources 150*a* and 150*b* and LED mounting boards 151*a* and 151*b* will be described. FIGS. 7A and 7B are explanatory views illustrating the configuration of the LED light sources 150*a* and 150*b* and the LED mounting boards 151*a* and 151*b*. FIG. 7A is an explanatory diagram showing the configurations of the LED light sources 150*a* and 150*b* and the LED mounting boards 151*a* and 151*b* of the present embodiment, and FIG. 7B is an explanatory view illustrating the configurations of the LED light source 500 and the LED mounting board 501 of the comparative example.

In the present embodiment, as illustrated in FIG. 7A, the LED mounting board 151*a* or 151*b* has a structure in which insulating boards are stacked in multiple layers. In order to describe the reason why this multi-layer structure is preferable, first, as a comparative example, the case where the LED mounting board 501 has a single-layer structure of an insulating board as illustrated in FIG. 7B will be described.

As illustrated in FIG. 7B, the LED light source 500 includes a plurality of LED elements 502. The plurality of LED elements 502 are arranged in a grid pattern on the front surface of the LED mounting board 501, which is a single-layer insulating board. FIG. 7B illustrates an example in which five LED elements 502*a* to 502*e* are arranged in each of the two rows L1 and L2, but, in reality, three or more rows and six or more LED elements 502 are arranged.

The plurality of LED elements 502 are connected by a wiring line 503. Specifically, the wiring line 503 is folded after sequentially connecting the LED elements 502*a* to 502*e* in the first row L1, and sequentially connects the LED elements 502*e* to 502*a* in the second row L2. In such a case, the polarities of the LED elements 502*a* to 502*e* in the first row L1 and the polarities of the LED elements 502*a* to 502*e* in the second row L2 are opposite to each other in the same direction. That is, the anode (positive pole) sides of the LED elements 502*a* to 502*e* in the first row L1 becomes the cathode (negative pole) sides of the ED elements 502*a* to 502*e* in the second row L2. As a result, the potential difference between respective LED elements 502*a* to 502*e* in the first row L1 and respective LED elements 502*a* to 502*e* in the second row L2 becomes large, and the insulation distance D2 needs to be large. Thus, many LED elements 502 cannot be disposed on the LED mounting board 501 (the density cannot be increased).

In contrast, as illustrated in FIG. 7A, the LED mounting boards 151*a* and 151*b* of the present embodiment have a structure in which the insulating boards 200 are stacked in multiple layers. Although the two-layer insulating boards 200*a* and 200*b* are illustrated in FIG. 7A, in reality, there may be three or more layers. In addition, a copper foil (not illustrated) is provided between the insulating boards 200*a* and 200*b*.

Each of the LED light sources 150*a* and 150*b* includes a plurality of LED elements 210. The plurality of LED elements 210 are arranged in a grid pattern on the front surface of the upper insulating board 200*a*. FIG. 7 A illustrates an example in which five LED elements 210*a* to 210*e* are arranged in each of the two rows L1 and L2, but, in reality, there are three or more rows and six or more LED elements 210 are arranged.

The plurality of LED elements 210 are connected by a wiring line 211. Specifically, the wiring line 211 extends to the lower insulating board 200*b* after sequentially connecting the LED elements 210*a* to 210*e* of the first row L1. In the insulating board 200*b*, the wiring line 211 is folded and arranged below the LED element 210*a* in the second row L2. The wiring line 211 extends upward and is connected to the LED element 210*a* in the second row L2, and further connects the LED elements 210*a* to 210*e* in sequence.

In such a case, the LED elements 210*a* to 210*e* in the first row L1 and the LED elements 210*a* to 210*e* in the second row L2 have the same polarity in the same direction. That is, the anode (positive polarity) sides of the LED elements 210*a* to 210*e* in the first row L1 are the anode (positive polarity) sides of the LED elements 210*a* to 210*e* in the second row L2. As a result, the potential difference between respective LED elements 210*a* to 210*e* in the first row L1 and respective LED elements 210*a* to 210*e* in the second row L2 becomes smaller so that the insulation distance D1 can be reduced. Thus, the number of the LED elements 210 on the LED mounting boards 151*a* and 151*b* can be increased (to increase the density). Therefore, according to the present embodiment, by using a large number of LED elements 210, it is possible to efficiently perform the heating process on a wafer W.

The insulation distance D1 between respective LED elements 210*a* to 210*e* in the first row L1 and respective LED elements 210*a* to 210*e* in the second row L2, which are adjacent to each other, is set to preferably 2.0 mm or less and more preferably 1.2 mm or less. In addition, the potential difference between respective LED elements 210*a* to 210*e* in the first row L1 and respective LED elements 210*a* to 210*e* in the second row L2, which are adjacent to each other, is set to preferably 150 V or less. The insulation distance D1 and the potential difference are set such that the heating rate when heating a wafer W reaches a desired rate, for example, 12 degrees C./sec.

As will be described later, the LED mounting boards 151*a* and 151*b* are divided into a plurality of zones Z1 to Z14, but in order to secure the insulation distance between respective zones Z1 to Z14, the insulating board 200*b* for turning back the wiring line 211 may be different for each of the zones Z1 to Z14. For example, the insulating board 200*b* in the zone Z1 may be the second layer, and the insulating board 200*b* in the zone Z2 may be the third layer.

In addition, each LED element 210 is connected to a copper inlay or via. With this copper inlay or via, the heat of the LED element 210 can be released to the outside of the LED mounting boards 151*a* and 151*b*.

Figure 8:
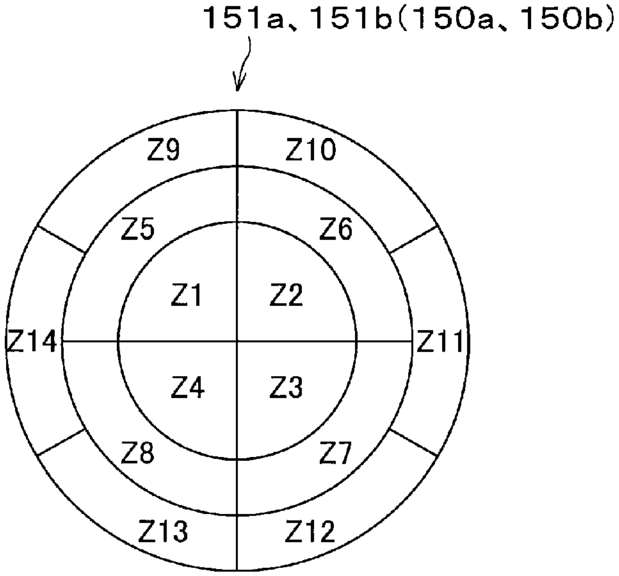
FIG. 8 is a plan view illustrating an outline of the configuration of an LED light source.
Figure 9:
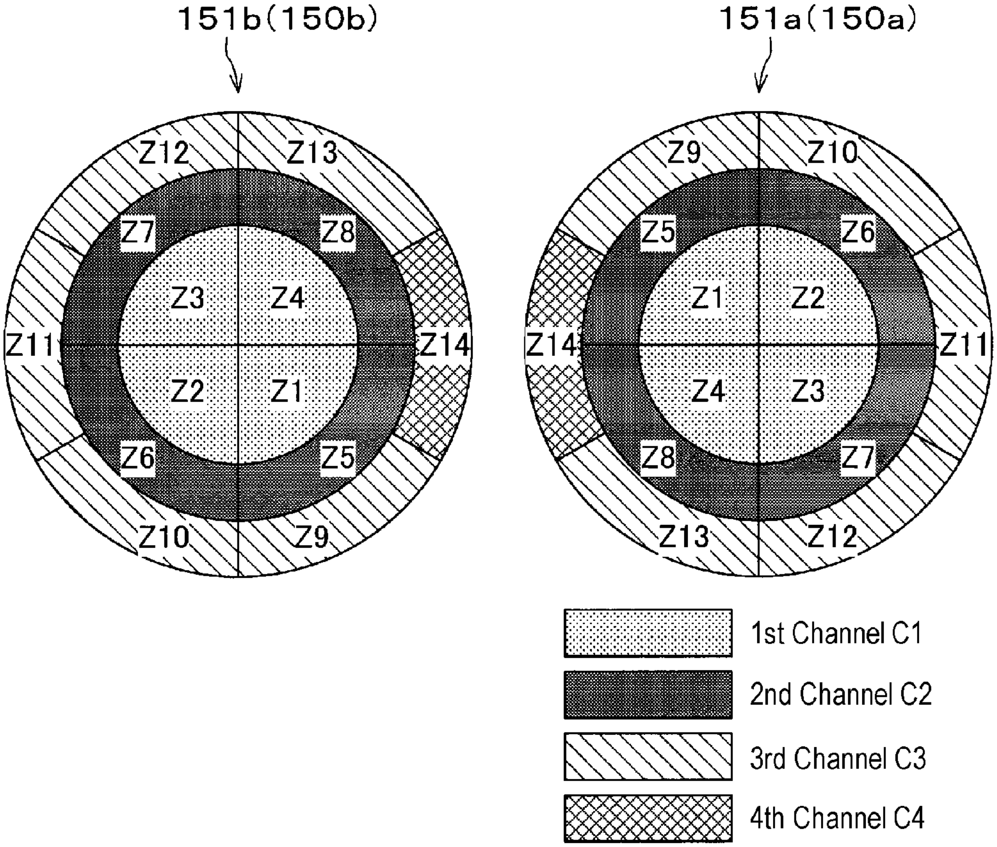
FIG. 9 is a plan view illustrating the configurations of control channels of two LED light sources.

Next, the configurations of LED light sources 150*a* and 150*b* will be described. FIG. 8 is a plan view illustrating an outline of the configuration of LED light sources 150*a* and 150*b*. FIG. 9 is a plan view illustrating the configuration of control channels of two LED light sources 150*a* and 150*b*.

As illustrated in FIG. 8, the LED mounting boards 151*a* and 151*b* are sectioned into a plurality of zones Z1 to Z14 in a plan view. The LED mounting boards 151*a* and 151*b* are radially sectioned into a central portion (Center), a middle portion (Middle), and an outer peripheral portion (Edge). The central portion is sectioned into four zones Z1 to Z4, the middle section is sectioned into four zones Z5 to Z8, and the outer peripheral portion is sectioned into six zones Z9 to Z14. The sectioned number of the LED mounting boards 151*a* and 151*b* is not limited to the present embodiment and may be set arbitrarily. For example, when a temperature difference occurs in a wafer surface due to the distances between the LED light sources 150*a* and 150*b* and peripheral members, the outer peripheral portion may be sectioned into a number according to the temperature difference.

About 200 LED elements 210 of LED light sources 150*a* and 150*b* are disposed in each of the zones Z1 to Z14. Since the numbers of LED elements 210 in respective zones Z1 to Z14 are equal in this way, the voltages in respective zones Z1 to Z14 can be made equal. In the present embodiment, the voltage of one LED element 210 is 1.8 V, and the voltage of each of the zones Z1 to Z14 is suppressed to 400 V. Since a maximum potential difference of about 200 V occurs between respective zones Z1 to Z14, it is necessary to secure an insulation distance corresponding to the potential difference. In addition, the number of LED elements 210 in each of the zones Z1 to Z14 is not limited to the present embodiment and may be arbitrarily set.

As illustrated in FIG. 9, the control channels (temperature control channels) of the LED light sources 150*a* and 150*b* are divided into four. The zones Z1 to Z4 in the central portion of each of the LED mounting boards 151*a* and 151*b* correspond to a first channel C1, the zones Z5 to Z8 in the middle portion correspond to a second channel C2, the zones Z9 to Z13 in the outer peripheral portion correspond to a third channel C3, and the zone Z14 in the outer peripheral portion correspond to a fourth channel C4. In this way, the LED mounting boards are controlled by being divided into the central portion, the middle portion, and the outer peripheral portion, that is, in concentric circles. In addition, in the two LED light sources 150*a* and 150*b*, the zones Z14 are adjacent to each other. In order to suppress the interference between the two LED light sources 150*a* and 150*b*, the zones Z9 to Z13 (the third channel C3) and the zone Z14 (the fourth channel C4) are set as separate channels.

The embodiments disclosed herein should be considered to be exemplary in all respects and not restrictive. The above-described embodiments may be omitted, replaced, or modified in various forms without departing from the scope and gist of the appended claims.

The following configurations also fall within the technical scope of the present disclosure.

(1) A heating/cooling device including: a chamber; a plurality of substrate holders provided inside the chamber, wherein each substrate holder is configured to hold a substrate; a plurality of LED light sources provided outside the chamber and corresponding to the plurality of substrate holders, respectively, wherein each LED light source is configured to irradiate the substrate held by the substrate holder corresponding thereto with LED light, and the LED light has a wavelength that heats the substrate; a plurality of transmission windows provided between the plurality of substrate holders and the plurality of LED light sources and corresponding to the plurality of LED light sources, respectively, wherein each transmission window is configured to transmit the LED light radiated from the LED light source corresponding thereto; and a plurality of gas distribution parts provided inside the chamber and corresponding to the plurality of substrate holders, respectively, wherein each gas distribution part is configured to distribute and supply a cooling gas to the substrate held by the corresponding substrate holder.

According to item (1), the heating/cooling device heats the substrate using the LED light source, so that the heating rate thereof is faster than the heating rate by a conventionally used heater. Therefore, the substrate heating process can be efficiently performed in a short time. In addition, the heating/cooling device cools the substrate by increasing the supply amount of the cooling gas from the gas distribution unit to a large flow rate, so that the cooling rate thereof is faster than the cooling rate of the conventional natural cooling. Therefore, the substrate cooling process can be efficiently performed in a short time. As a result, the throughput of substrate processing can be improved.

(2) The heating/cooling device set forth in item (1), further including: a plurality of moving mechanisms provided to correspond to the plurality of substrate holders, wherein each moving mechanism is configured to move the substrate holder between the transmission window and the gas distribution part.

According to item (2), it is possible to dispose the substrate holder (the substrate) at an arbitrary height position by the moving mechanism. Therefore, it is possible to appropriately adjust a position for performing the substrate heating process and a position for performing the substrate cooling process.

(3) The heating/cooling device set forth in item (1) or (2), further including: a plurality of temperature measuring parts provided to correspond to the plurality of substrate holders, wherein each temperature measuring part is configured to measure a temperature of the substrate held on the substrate holder.

According to item (3), by measuring the temperature of the substrate by the temperature measuring part, it is possible to feedback-control the LED light source and thus to appropriately adjust the heating temperature of the substrate.

(4) The heating/cooling device set forth in any one of items (1) to (3), further including: a plurality of LED mounting boards provided to correspond to the plurality of LED light sources, wherein a front surface of each LED mounting board is mounted with the LED light source; and a plurality of cooling plates provided to correspond to the plurality of LED mounting boards, wherein each cooling plate is provided on the rear surface of the LED mounting board and configured to cool the LED light source.

According to item (4), it is possible to appropriately operate the LED light source by cooling the LED light source by the cooling plate.

(5) The heating/cooling device set forth in item (4), further including: an LED control board provided on a side opposite to the LED mounting board with respect to the cooling plate, wherein the cooling plate is further configured to cool a component provided on the front surface of the LED control board.

According to item (5), it is possible to appropriately operate the component by cooling the component of the LED control board by the cooling plate. Furthermore, the cooling plate is excellent in efficiency since the cooling plate is capable of cooling the LED light source and the LED control board at the same time.

(6) The heating/cooling device set forth in item (4) or (5), wherein the LED mounting board has a structure in which insulating boards are stacked in multiple layers, the LED light source includes a plurality of LED elements arranged in a plurality of rows on a front surface of the insulating board on an outermost layer, and a wiring line connecting the LED elements in one row extends downward to be disposed on the insulating board in a lower layer, and further extends upward to be connected to the LED elements in a row adjacent to the one row.

According to item (6), since it is possible to make the polarities of adjacent LED elements the same in the same direction, it is possible to reduce the insulation distance by reducing the potential difference between the adjacent LED elements. As a result, it is possible to increase the density of the LED elements in the LED mounting substrate so that the substrate heating process can be efficiently performed.

(7) The heating/cooling device set forth in any one of items (4) to (6), wherein the LED mounting board is sectioned into a plurality of zones in a plan view, and the plurality of LED elements are disposed in the zones.

According to item (7), it is possible to implement a more accurate heating process by sectioning the LED mounting board into a plurality of zones.

(8) The heating/cooling device set forth in any one of items (1) to (7), wherein the LED light has a wavelength of 400 nm to 1,100 nm.

According to item (8), the LED light having a wavelength range of 400 nm to 1,100 nm is absorbed by the substrate while passing through the transmission window. Therefore, it is possible to efficiently heat the substrate.

(9) The heating/cooling device set forth in any one of items (1) to (8), wherein the substrate holder is further configured to hold a plurality of locations of an outer peripheral portion of the substrate.

According to item (9), since the outer peripheral portion is held, the LED light is not disturbed by the substrate holder, so that it is possible to appropriately irradiate the substrate with the LED light.

(10) The heating/cooling device set forth in item (9), wherein, in the substrate holder, a holding member that holds the outer peripheral portion of the substrate is configured to transmit the LED light from the LED light source.

According to item (10), since the holding member transmits the LED light, it is possible to appropriately irradiate the substrate with the LED.

(11) The heating/cooling device set forth in any one of items (1) to 10, further including: a plurality of heating plates provided to correspond to the plurality of transmission windows, wherein each heating plate is configured to heat the transmission window and further to transmit the LED light from the LED light source.

According to item (11), by heating the transmission window with the heating plate, it is possible to suppress the adhesion of deposits to the transmission window and to suppress blurring of the transmission window. Furthermore, since the heating plate transmits the LED light, it is possible to appropriately irradiate the substrate with the LED light.

(12) A heating/cooling method including: a) a process of carrying a plurality of substrates into a chamber to hold the substrates on a substrate holder; b) a process of moving the substrate holder to an LED light source side provided outside the chamber; c) a process of irradiating the substrates held on the substrate holder with LED light from the LED light source to heat the substrates; d) a process of moving the substrate holder to a gas distribution part side provided inside the chamber; and e) a process of cooling the substrates by distributing and supplying a cooling gas from the gas distribution part to the substrates held on the substrate holder.

(13) The heating/cooling method set forth in item (12), wherein, in the process c), a purge gas is supplied into the chamber from the gas distribution part, and a supply amount of the cooling gas in the process e) is larger than a supply amount of the purge gas in the process c).

(14) The heating/cooling method set forth in item (12) or (13), wherein a pressure inside the chamber in the process e) is higher than a pressure inside the chamber in the process c).

(15) The heating/cooling method set forth in any one of items (12) to (14), wherein, in the process c), a temperature of the substrates held on the substrate holder is measured, and the LED light source is feedback-controlled based on a measurement result of the temperature of the substrates.

EXPLANATION OF REFERENCE NUMERALS

62: PHT module, 100: chamber, 114*a*, 114*b*: transmission window, 140*a*, 140*b*: shower head, 150*a*, 150*b*: LED light source, W: wafer

What is claimed is:

1. A heating/cooling device comprising:
a chamber;
a plurality of substrate holders provided inside the chamber, wherein each substrate holder is configured to hold a substrate;
a plurality of LED light sources provided outside the chamber and corresponding to the plurality of substrate holders, respectively, wherein each LED light source is configured to irradiate the substrate held by the substrate holder corresponding thereto with LED light, and the LED light has a wavelength that heats the substrate;
a plurality of transmission windows provided between the plurality of substrate holders and the plurality of LED light sources, and corresponding to the plurality of LED light sources, respectively, wherein each transmission window is configured to transmit the LED light radiated from the LED light source corresponding thereto;
a plurality of gas distribution parts provided inside the chamber and corresponding to the plurality of substrate holders, respectively, wherein each gas distribution part is configured to distribute and supply a cooling gas to the substrate held by the corresponding substrate holder;
a plurality of LED mounting boards corresponding to the plurality of LED light sources, wherein a front surface of each of the LED mounting boards is mounted with the corresponding LED light source;
a plurality of cooling plates corresponding to the plurality of LED mounting boards, wherein each of the cooling plates is provided on a rear surface of the corresponding LED mounting board and configured to cool the corresponding LED light source; and
an LED control board provided on a side opposite to the LED mounting boards with respect to the cooling plates,
wherein each of the cooling plates is further configured to cool a component provided on a front surface of the LED control board.

2. The heating/cooling device of claim 1, further comprising:
a plurality of moving mechanisms provided to correspond to the plurality of substrate holders, wherein each moving mechanism is configured to move the substrate holder between the transmission window and the gas distribution part.

3. The heating/cooling device of claim 2, further comprising:
a plurality of temperature measuring parts provided to correspond to the plurality of substrate holders, wherein each temperature measuring part is configured to measure a temperature of the substrate held on the substrate holder.

4. The heating/cooling device of claim 1, wherein each of the LED mounting boards has a structure in which insulating boards are stacked in multiple layers, the corresponding LED light source includes a plurality of LED elements arranged in a plurality of rows on a front surface of the insulating board on an outermost layer, and a wiring line connecting the plurality of LED elements in one row extends downward to be disposed on the insulating board in a lower layer, and further extends upward to be connected to the plurality of LED elements in a row adjacent to the one row.

5. The heating/cooling device of claim 4, wherein each of the LED mounting boards is sectioned into a plurality of zones in a plan view, and the plurality of LED elements is disposed in the zone.

6. The heating/cooling device of claim 5, wherein the wavelength of the LED light ranges from 400 nm to 1,100 nm.

7. The heating/cooling device of claim 1, wherein each of the LED mounting boards is sectioned into a plurality of zones in a plan view, and the plurality of LED elements is disposed in the zone.

8. The heating/cooling device of claim 1, further comprising:

a plurality of temperature measuring parts provided to correspond to the plurality of substrate holders, wherein each temperature measuring part is configured to measure a temperature of the substrate held on the substrate holder.

9. The heating/cooling device of claim 1, wherein the wavelength of the LED light ranges from 400 nm to 1,100 nm.

10. The heating/cooling device of claim 1, wherein the substrate holder is further configured to hold a plurality of locations of an outer peripheral portion of the substrate.

11. The heating/cooling device of claim 10, wherein, in the substrate holder, a holding member that holds the outer peripheral portion of the substrate is configured to transmit the LED light from the LED light sources.

12. The heating/cooling device of claim 1, further comprising:

a plurality of heating plates provided to correspond to the plurality of transmission windows, wherein each heating plate is configured to heat the transmission window and further to transmit the LED light from the LED light sources.

* * * * *